(12) United States Patent
    Cortie et al.

(10) Patent No.: US 10,018,926 B2
(45) Date of Patent: Jul. 10, 2018

(54) LITHOGRAPHIC APPARATUS AND METHOD OF MANUFACTURING A LITHOGRAPHIC APPARATUS

(71) Applicant: ASML Netherlands B.V., Veldhoven (NL)

(72) Inventors: Rogier Hendrikus Magdalena Cortie, Ittervoort (NL); Christianus Wilhelmus Johannes Berendsen, Roermond (NL); Andre Bernardus Jeunink, Bergeijk (NL); Adrianus Hendrik Koevoets, Mierlo (NL); Jim Vincent Overkamp, Eindhoven (NL); Siegfried Alexander Tromp, Papendrecht (NL); Van Vuong Vy, Eindhoven (NL); Daniel Elza Roeland Audenaerdt, Veldhoven (NL)

(73) Assignee: ASML NETHERLANDS, B.V., Veldhoven (NL)

( * ) Notice: Subject to any disclaimer, the term of this patent is extended or adjusted under 35 U.S.C. 154(b) by 3 days.

(21) Appl. No.: 15/314,841

(22) PCT Filed: May 7, 2015

(86) PCT No.: PCT/EP2015/060039
§ 371 (c)(1),
(2) Date: Nov. 29, 2016

(87) PCT Pub. No.: WO2015/188988
PCT Pub. Date: Dec. 17, 2015

(65) Prior Publication Data
US 2018/0067398 A1    Mar. 8, 2018

(30) Foreign Application Priority Data

Jun. 10, 2014 (EP) .................................. 14171800
Mar. 18, 2015 (EP) .................................. 15159551

(51) Int. Cl.
    *G03B 27/32* (2006.01)
    *G03B 27/52* (2006.01)
    (Continued)

(52) U.S. Cl.
    CPC ........ *G03F 7/7095* (2013.01); *G03F 7/70341* (2013.01); *G03F 7/70733* (2013.01); *G03F 7/70875* (2013.01); *G03F 7/70891* (2013.01)

(58) Field of Classification Search
    CPC ............. G03F 7/70341; G03F 7/70733; G03F 7/70875; G03F 7/70891; G03F 7/7095
    (Continued)

(56) References Cited

U.S. PATENT DOCUMENTS 6,952,253 B2   10/2005 Lof et al.
7,213,963 B2    5/2007 Lof et al.
(Continued)

FOREIGN PATENT DOCUMENTS

EP   1 376 185   1/2004
EP   1 420 298   5/2004
(Continued)

OTHER PUBLICATIONS

International Search Report and Written Opinion dated Jul. 28, 2015 in corresponding International Patent Application No. PCT/EP2015/060039.
(Continued)

*Primary Examiner* — Colin Kreutzer
(74) *Attorney, Agent, or Firm* — Pillsbury Winthrop Shaw Pittman, LLP

(57) ABSTRACT

A lithographic apparatus comprising: a channel (46) for the passage therethrough of a two phase flow, wherein the channel is formed within a block, the block being of a first material (100); a second material (160) between the first material and the channel, wherein the second material has a
(Continued)

specific heat capacity higher than that of the first material; and a third material (90) between the second material and the channel, wherein the third material has a thermal conductivity higher than that of the second material.

20 Claims, 8 Drawing Sheets

(51) Int. Cl.
  *H02K 41/02* (2006.01)
  *G03F 7/20* (2006.01)
(58) Field of Classification Search
  USPC .................................. 310/12.06; 355/30, 77
  See application file for complete search history.

(56) References Cited

U.S. PATENT DOCUMENTS

| | | | |
|---|---|---|---|
| 8,514,365 | B2 | 8/2013 | De Jong et al. |
| 2004/0207824 | A1 | 10/2004 | Lof et al. |
| 2005/0264778 | A1 | 12/2005 | Lof et al. |
| 2006/0033892 | A1* | 2/2006 | Cadee ................. G03F 7/70341 355/30 |
| 2006/0119818 | A1* | 6/2006 | Nagasaka ........... G03F 7/70341 355/53 |
| 2006/0250593 | A1* | 11/2006 | Nishii ................. G03F 7/70341 355/53 |
| 2008/0043210 | A1 | 2/2008 | Shibuta |
| 2008/0297744 | A1 | 12/2008 | De Jong et al. |
| 2010/0045949 | A1 | 2/2010 | Nakano et al. |
| 2011/0222032 | A1 | 9/2011 | Ten Kate et al. |
| 2015/0109599 | A1 | 4/2015 | Koevoets et al. |
| 2015/0131064 | A1* | 5/2015 | Laurent ............... G03F 7/70341 355/30 |

FOREIGN PATENT DOCUMENTS

| | | |
|---|---|---|
| JP | 2010-287665 A | 12/2010 |
| JP | 2011-192992 A | 9/2011 |
| WO | 2005/124835 A1 | 12/2005 |
| WO | 2013/178438 | 12/2013 |
| WO | 2013/178484 A1 | 12/2013 |

OTHER PUBLICATIONS

Notification of Reasons for Refusal issued in corresponding Japanese Patent Application No. 2016-572686 dated Nov. 7, 2017 with English translation.

First Office Action issued in corresponding Chinese Patent Application No. 201580031089.0 dated Sep. 1, 2017 with English translation.

\* cited by examiner

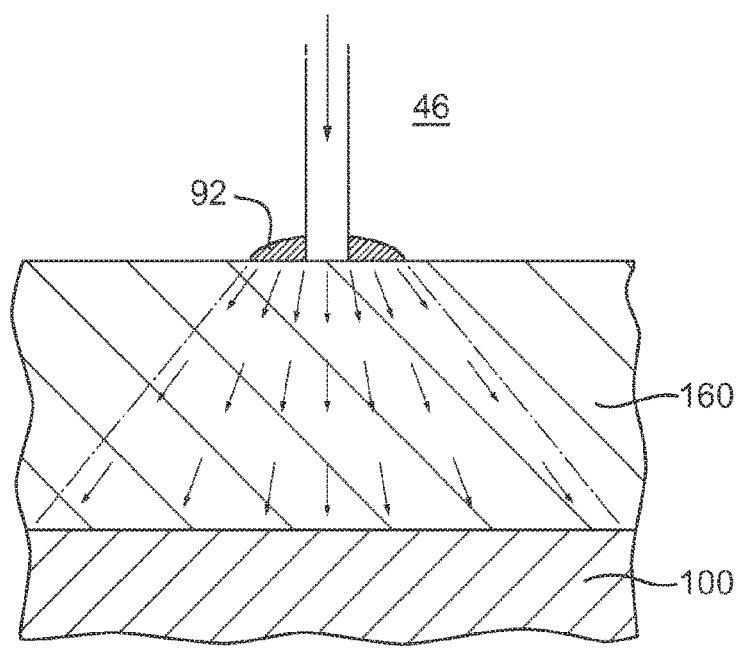
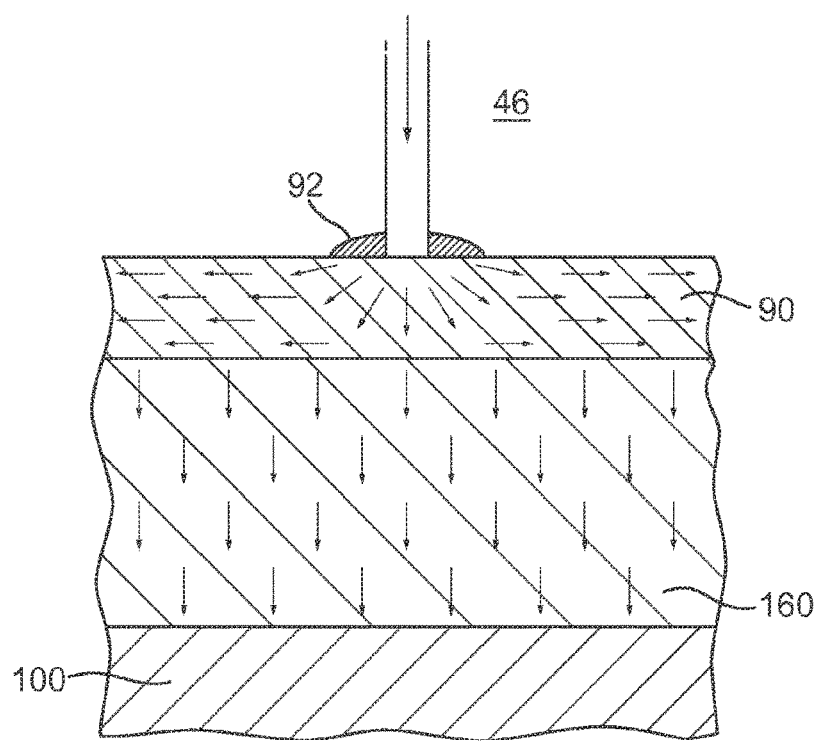

LITHOGRAPHIC APPARATUS AND METHOD OF MANUFACTURING A LITHOGRAPHIC APPARATUS

CROSS-REFERENCE TO RELATED APPLICATIONS

This application is the U.S. national phase entry of PCT patent application no. PCT/EP2015/060039, which was filed on May 7, 2015, which claims the benefit of priority of European patent application no. 14171800.7, which was filed on Jun. 10, 2014, and of European patent application no. 15159551.9, which was filed on Mar. 18, 2015, and which are incorporated herein in their entirety by reference.

FIELD

The present invention relates to a lithographic apparatus and a method of manufacturing a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

Handling immersion liquid in a lithographic apparatus brings with it one or more problems of liquid handling. A gap normally exists between an object, such as a substrate and/or a sensor, and a table (e.g. a substrate table or a measurement table) around the edge of the object (e.g., substrate and/or sensor), U.S. patent application publication US 2005-0264778, discloses filling that gap with material or providing a liquid source or low pressure source to deliberately fill the gap with liquid in order to avoid bubble inclusion as the gap passes under the liquid supply system and/or to remove any liquid which does enter the gap.

Liquid from a gap between an edge of an object and a table on which the object is position may be removed through a channel. When the liquid is removed, gas may also be removed through the channel. A two phase flow of liquid and gas may pass through the channel. Such a channel for two phase flow may be present in other parts of the lithographic apparatus, for example in a liquid confinement system. Such a two phase flow can lead to undesirable temperature changes in the component that the channel is formed in, or other nearby components.

SUMMARY

It is desirable, for example, to provide far a reduction in the undesirable temperature changes caused by a two phase flow through a channel in a lithographic apparatus.

According to an aspect, there is provided a lithographic apparatus comprising: channel for the passage therethrough of a two phase flow, wherein the channel is formed within a block, the block being of a first material; a second material between the first material and the channel, wherein the second material has a specific heat capacity higher than that of the first material; and a third material between the second material and the channel, wherein the third material has a thermal conductivity higher than that of the second material.

According to an aspect, there is provided a lithographic apparatus comprising: a channel for the passage therethrough of a two phase flow, wherein the channel is formed within a block, the block being of a first material; a second material between the first material and the channel, wherein the second material has a thermal conductivity lower than that of the first material; and a third material between the second material and the channel, wherein the third material has a thermal conductivity higher than that of the second material.

According to an aspect, there is provided a lithographic apparatus comprising: a channel for the passage therethrough of a two phase flow, wherein the channel is formed within a block, the block being of a first material; and a second material between the first material and the channel, wherein the second material $\lambda/(\rho C_{specific}) \leq 1 \times 10^{-7}$ m$^2$s$^{-1}$, where $\lambda$ is a thermal conductivity of the second material in Wm$^{-1}$K$^{-1}$, $\rho$ is a density of the second material in kgm$^{-3}$ and $C_{specific}$ is a specific heat capacity of the second material in Jkg$^{-1}$K$^{-1}$.

According to an aspect, there is provided a method of manufacturing a lithographic apparatus, the method comprising: providing a block of a first material within which a channel is formed; providing for the passage of a two phase flow through the channel; providing between the first material and the channel a second material, wherein the second material has a specific heat capacity higher than that of the first material; and providing between the second material and the channel a third material, wherein the third material has a thermal conductivity higher than that of the second material.

According to an aspect, there is provided method of manufacturing a lithographic apparatus, the method comprising: providing a block of a first material within which a channel is formed; providing for the passage of a two phase flow through the channel; providing between the first material and the channel a second material, wherein the second material has a thermal conductivity lower than that of the first material; and providing between the second material and the channel a third material, wherein the third material has a thermal conductivity higher than that of the second material.

According to an aspect, there is provided method of manufacturing a lithographic apparatus, the method comprising: providing a block of a first material within which a channel is formed; providing for the passage of a two phase flow through the channel; and providing between the first material and the channel a second material, wherein the second material satisfies $\lambda/(\rho C_{specific}) \leq 1 \times 10^{-7}$ m$^2$s$^{-1}$, where $\lambda$ is a thermal conductivity of the second material in Wm$^{-1}$K$^1$, $\rho$ is a density of the second material in kgm$^{-3}$ and $C_{specific}$ is a specific heat capacity of the second material in Jkg$^{-1}$K$^{-1}$.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 7-9 depict, in cross-section, a part of a substrate table of an embodiment;

DETAILED DESCRIPTION

Figure 1:
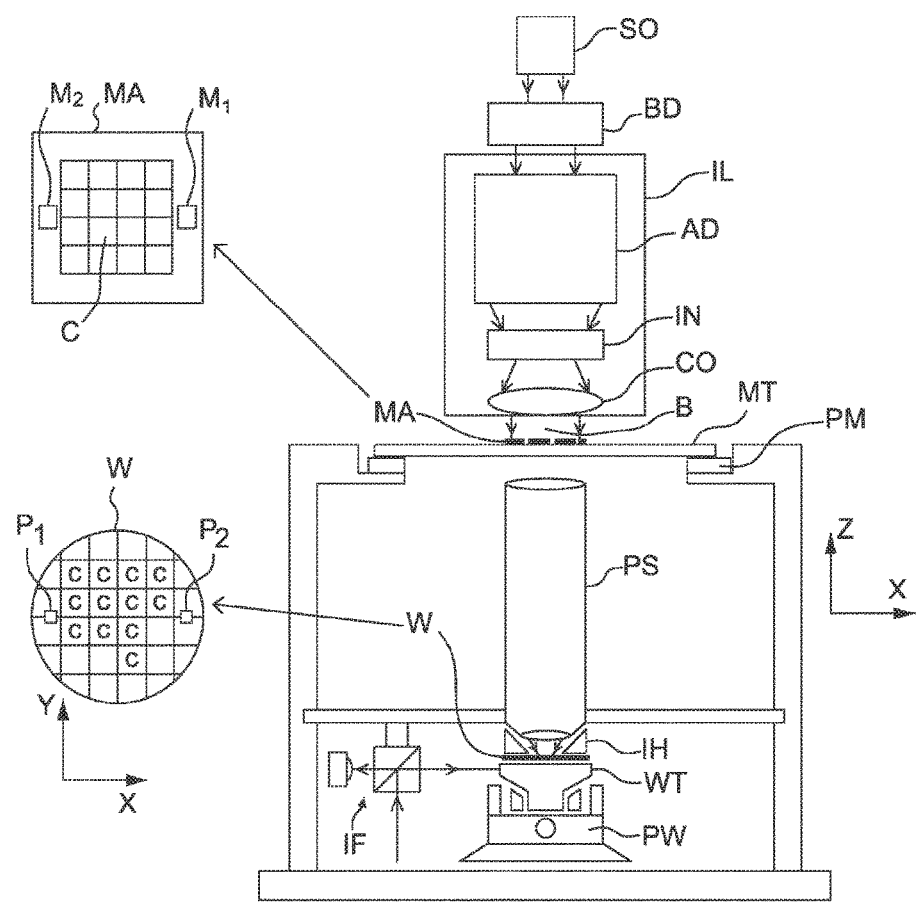
FIG. 1 depicts a lithographic apparatus according to an embodiment of the invention.

FIG. 1 schematically depicts lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a program enable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

Figure 2:
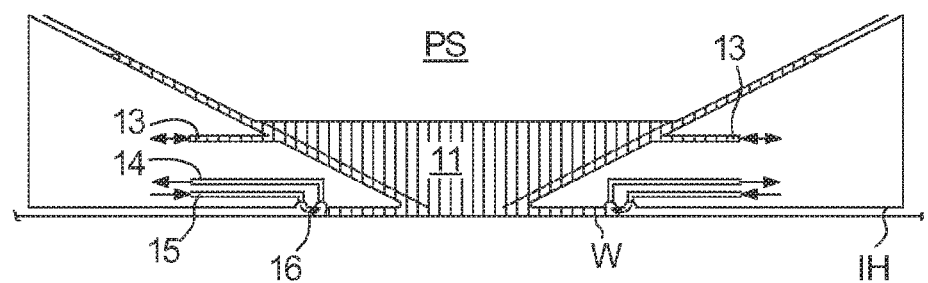
FIG. 2 depicts a liquid supply system for use in a lithographic projection apparatus.

An arrangement which has been proposed is to provide the liquid supply system with a liquid confinement structure which extends along at least a part of a boundary of the space between the final element of the projection system and the substrate, substrate table or both. Such an arrangement is illustrated in FIG. 2. The arrangement illustrated in FIG. 2 and described below may be applied to the lithographic apparatus described above and illustrated in FIG. 1.

FIG. 2 schematically depicts a localized liquid supply system or fluid handling system with a liquid confinement structure IH, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) In an embodiment, a seal is formed between the liquid confinement structure IH and the surface of the substrate W and which may be a contactless seal such as a gas seal (such a system with a gas seal is disclosed in European patent application publication no. EP-A-1,420,298) or a liquid seal.

The liquid confinement structure IH at least partly contains liquid in the space 11 between a final element of the projection system PS and the substrate W. The space 11 is at least partly formed by the liquid confinement structure IH positioned below and surrounding the final element of the projection system PS. Liquid is brought into the space below the projection system PS and within the liquid confinement structure IH by liquid inlet 13. The liquid may be removed by liquid outlet 13.

The liquid may be contained in the space 11 by a gas seal 16 which, during use, is formed between the bottom of the liquid confinement structure IH and the surface of the substrate W. The gas in the gas seal is provided under pressure via inlet 15 to the gap between the liquid confinement structure IH and substrate W. The gas is extracted via a channel associated with outlet 14. The overpressure on the gas inlet 15, vacuum level on the outlet 14 and geometry of the gap are arranged so that there is a high-velocity gas flow 16 inwardly that confines the liquid. The force of the gas on the liquid between the liquid confinement structure IH and the substrate W contains the liquid in a space 11. Such a system is disclosed in United States patent application publication no. US 2004-0207824, which is hereby incorporated by reference in its entirety. In an embodiment, the liquid confinement structure IH does not have a gas seal.

In a localized area liquid supply system, the substrate W is moved under the projection system PS and the liquid supply system. When, for example, an edge of the substrate W is to be imaged or when a sensor on the substrate table (or on a measurement table) is to be imaged or the substrate table is to be moved such that a dummy substrate or so-called closing plate can be positioned under the liquid supply system to enable, for example, substrate swap to take place, an edge of the substrate W (or other object) will pass under the space 11. Liquid may leak into the gap between the substrate W and substrate table WT. This liquid may be forced in under hydrostatic or hydrodynamic pressure or the force of a gas knife or other gas flow creating device.

Figure 3:
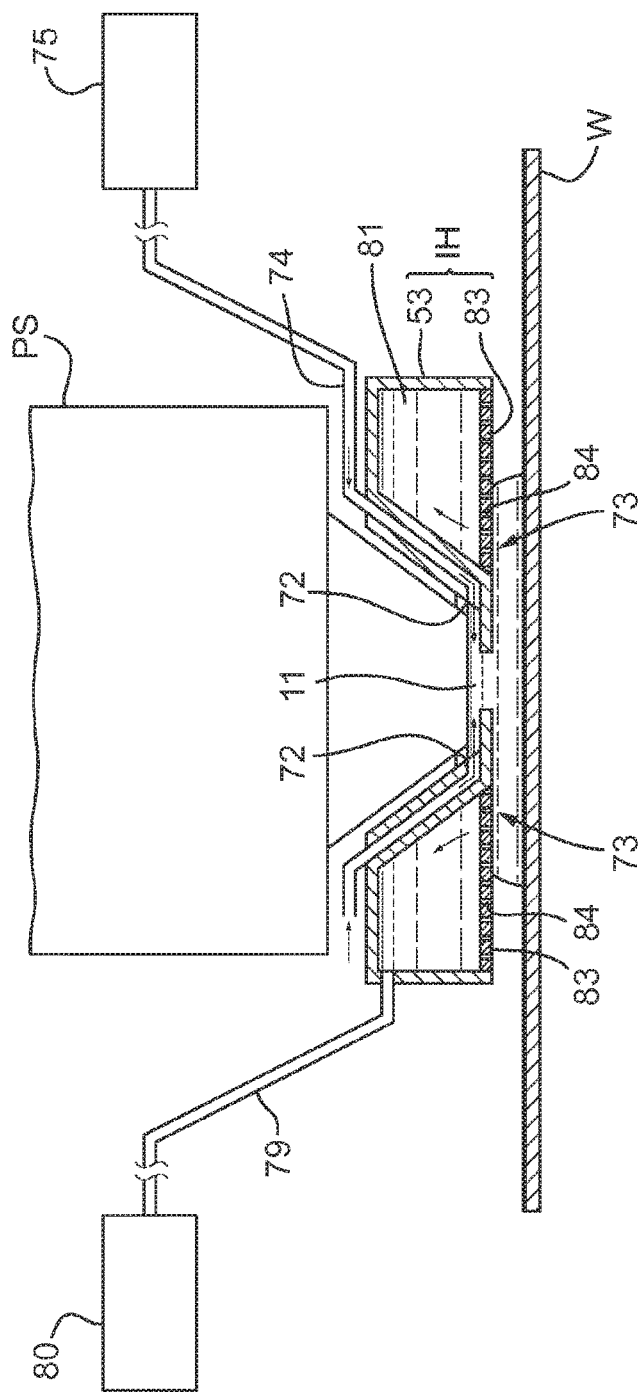
FIG. 3 is a side cross sectional view that depicts a further liquid supply system according to an embodiment.

FIG. 3 is a side cross sectional view that depicts a further liquid supply system or fluid handling system according to an embodiment. The arrangement illustrated in FIG. 3 and described below gray be applied to the lithographic apparatus described above and illustrated in FIG. 1. The liquid supply system is provided with a liquid confinement structure IH, which extends along at least a part of a boundary of the space between the final element of the projection system PS and the substrate table WT or substrate W. (Please note that reference in the following text to surface of the substrate W also refers in addition or in the alternative to a surface of the substrate table WT, unless expressly stated otherwise.)

The liquid confinement structure IH at least partly contains liquid in the space 11 between a final element of the projection system PS and the substrate W. The space 11 is at least partly formed by the liquid confinement structure IH positioned below and surrounding, the final element of the projection system PS. In an embodiment, the liquid confinement structure IH comprises a main body member 53 and a porous member 83. The porous member 83 is plate shaped and has a plurality of holes (i.e., openings or pores). In an embodiment, the porous member 83 is a mesh plate wherein numerous small holes 84 are formed in a mesh. Such a system is disclosed in United States patent application publication no. US 2010/0045949 A1, which is hereby incorporated by reference in its entirety.

The main body member 53 comprises supply ports 72, which are capable of supplying the liquid to the space 11, and a recovery port 73, which is capable of recovering the liquid from the space 11. The supply ports 72 are connected to a liquid supply apparatus 75 via passageways 74. The liquid supply apparatus 75 is capable of supplying the liquid to the supply ports 72. The liquid that is fed from the liquid supply apparatus 75 is supplied to each of the supply ports 72 through the corresponding passageway 74. The supply ports 72 are disposed in the vicinity of the optical path at prescribed positions of the main body member 53 that face the optical path. The recovery port 73 is capable of recovering the liquid from the space 11. The recovery port 73 is connected to a liquid recovery apparatus 80 via a passageway 79. The liquid recovery apparatus 80 comprises a vacuum system and is capable of recovering the liquid by suctioning it via the recovery port 73. The liquid recovery apparatus 80 recovers the liquid LQ recovered via the recovery port 23 through the passageway 29. The porous member 83 is disposed in the recovery port 73.

In an embodiment, to form the space 11 with the liquid between the projection system PS and the liquid confinement structure IH on one side and the substrate W on the other side, liquid is supplied from the supply ports 72 to the space 11 and the pressure in a recovery chamber 81 in the liquid confinement structure IH is adjusted to a negative pressure so as to recover the liquid via the holes 84 (i.e., the recovery port 73) of the porous member 83. Performing the liquid supply operation using the supply ports 72 and the liquid recovery operation using the porous member 83 forms the space 11 between the projection system PS and the liquid confinement structure IH on one side and the substrate W on the other side.

Although one or more embodiments of the invention will be described below in relation to a channel 46 formed in a substrate table WT and the edge of a substrate W, the one or more embodiments are equally applicable to a channel for the passage there through of a two phase flow formed within other components including, but not limited to, a support structure (e.g. mask table) MT and a liquid confinement structure IR. For example, the one or more embodiments are equally applicable to the channel associated with the outlet 14, which is depicted in FIG. 2. Thus, any reference below to the substrate table WT should be considered to be synonymous with any other components within which a channel is formed for the passage there through for a two phase flow.

Figure 4:
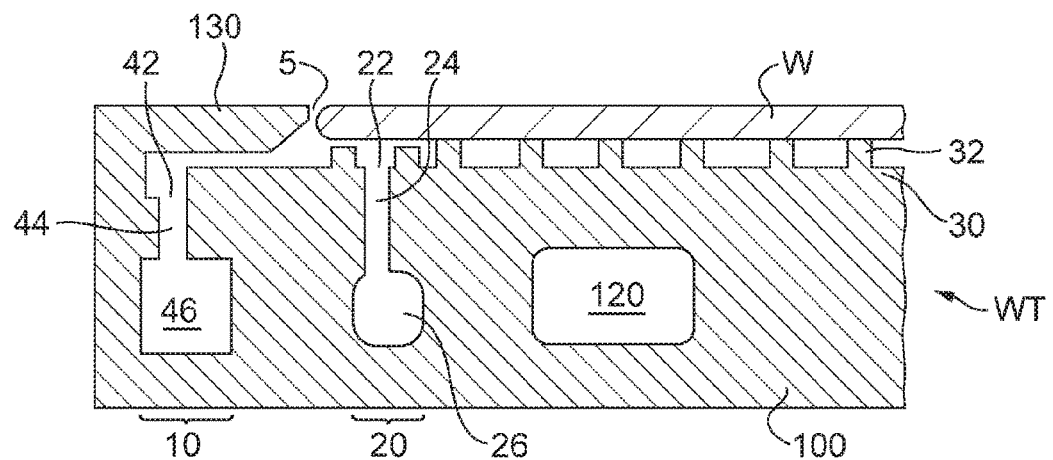
FIGS. 4-5 depict, in cross-section, a part of a substrate table of an embodiment.

FIG. 4 illustrates part of a lithographic apparatus according to an embodiment of the present invention. The arrangement illustrated in FIG. 4 and described below may be applied to the lithographic apparatus described above and illustrated in FIG. 1. FIG. 4 is a cross-section through a substrate table WT and a substrate W. A gap 5 exists between an edge of the substrate W and an edge of the substrate table WT. When the edge of the substrate W is being imaged or at other times such as when the substrate W first moves under the projection system PS (as described above), the space 11 filled with liquid by the liquid confinement structure IH (for example) will pass at least partly over the gap 5 between the edge of the substrate W and the edge of the substrate table WT. This can result in liquid front the space 11 entering the gap 5.

The substrate W is held by a substrate holder 30 (e.g. a pimple or burl table) comprising one or more projections 32 (i.e., burls). The substrate holder 30 is an example of an object holder. Another example of an object holder is a mask holder. An under-pressure applied between the substrate W and the substrate table WT helps ensure that the substrate W is held firmly in place. However, if liquid gets between the substrate W and the substrate holder 30 this can lead to difficulties, particularly when unloading the substrate W.

In order to deal with the liquid entering that gap 5 at least one drain 10, 20 is provided at the edge of the substrate W to remove liquid which enters the gap 5. In the embodiment of FIG. 4 two drains 10, 20 are illustrated though there may only be one drain or there could be more than two drains. In an embodiment, each of the drains 10, 20 is annular so that the whole periphery of the substrate W is surrounded.

A primary function of the first drain 10 (which is radially outward of the edge of the substrate W/substrate holder 30) is to help prevent bubbles of gas from entering the space 11 where the liquid of the liquid confinement structure IH is present. Such bubbles may deleteriously affect the imaging of the substrate W. The first drain 10 is present to help avoid gas in the gap 5 escaping into the space 11 in the liquid confinement structure IH. If gas does escape into the space 11, this can lead to a bubble which floats within the space 11. Such a bubble, if in the path of the projection beam, may lead to an imaging error. The first drain 10 is configured to remove gas from the gap 5 between the edge of the substrate W and the edge of the recess in the substrate table WT in which the substrate W is placed. The edge of the recess in the substrate table WT may be defined by a cover ring 130 which is optionally separate from a support body of the substrate table WT. The support body of the substrate table WT is formed of a first material 100. The cover ring 130 may be shaped, in plan, as a ring and surrounds the outer edge of the substrate W. The first drain 10 extracts mostly gas (say between 20 and 100 normal liters per minute (Nl/min)) and only a small amount of immersion liquid (say about 10-20 ml/min). With such a two phase flow, the immersion liquid evaporates thus cooling down the substrate table WT surrounding the edge of the substrate W. This can result in deformation of the substrate W, eventually leading to decreased overlay performance.

The second drain 20 (which is radially inward of the edge of the substrate W/substrate holder 30) is provided to help prevent liquid which finds its way from the gap 5 to underneath the substrate W from preventing efficient release of the substrate W from the substrate table WT after imaging. The provision of the second drain 20 reduces or eliminates any problems which may occur due to liquid finding its way underneath the substrate W.

Both the first and second drains 10, 20 remove liquid by way of an under-pressure. That is, both drains are connected via one or more outlets (not illustrated) to an under-pressure source. The under-pressure source effectively removes liquid which enters the respective drain 10, 20. However, the under-pressure source is also effective to draw gas in from outside of the gap 5 above the substrate table WT (or in the case of the second drain 20, also from the substrate holder 30) through the respective drains 10, 20 and out through the outlets. This flow of liquid and gas is not constant or uniform around the periphery of the drains 10, 20 during use of the immersion apparatus. One or more measures may be taken to only connect the outlets to the under-pressure source when there is a chance of liquid entering the gap 5, but there is still the risk of an uneven thermal load being applied to the substrate table WT because of the varying amount of gas and/or liquid which passes through the drains 10, 20. These temporal and/or positional uneven flows of gas and liquid result in different rates of evaporation of liquid in the drains 10, 20 thereby leading to variation in the heat losses generated by the drains 10, 20 during exposure of a batch of substrates. This is because the substrate table WT is only positioned such that an edge of the substrate W is under the space 11 during certain times which is exposure routing dependent. Thus for the first substrate of a batch of substrates, the evaporation load is at different locations at the periphery of the substrate than for the following substrates (because for the first substrate there has not been a preceding substrate moving under the projection system PS during which an uneven evaporation load is set up). Furthermore, the tinting delay of a substrate delivery from the track at the start of a new batch results in an evaporation load change due to drying up of the drains 10, 20 (and thereby less evaporation). Even if the thermal load is substantially constant, it can be difficult to help ensure a uniform temperature of the substrate table WT as a result.

The construction details of the drain 10 will be described in detail below. However, it should be understood that the principles herein can be applied to any type of channel in an immersion apparatus which by virtue of use of the apparatus is provided with a varying flow of liquid and/or gas through it and can thereby result in a thermal load, particularly where it results in varying amounts of evaporation and thereby varying thermal load.

The substrate table WT comprises a first material 100. In an embodiment at least one thermal conditioning channel 120 is provided for the passage therethrough of a thermal conditioning liquid to help maintain the temperature of the first material 100 at a certain (e.g., predetermined) temperature and/or uniformity. However, this need not necessarily be the case. In an embodiment heaters are provided to help maintain the temperature of the first material 100 at a certain (e.g., predetermined) temperature and/or uniformity. In an embodiment the heaters are electric heaters or Peltier heaters, for example. In an embodiment the thermal conditioning channel 120 and the heaters are provided. The first and second drains 10, 20 are each provided with an opening 42, 22 and a channel 46, 26. The channel 46, 26 is in fluid communication with the respective opening 42, 22 through a passageway 44, 24. The opening 42, 22 may be provided at one or more discrete locations around the periphery of the edge of the substrate W and may, in plan, be slits or circular openings or any other shape. In an embodiment three discrete circular openings are provided around the edge of the substrate W, for instance. An opening 42, 22 may only be a small opening, for example of 2 mm diameter, in the periphery of a substrate W.

An embodiment of the invention is illustrated as being applied to the first drain 10 in the below described embodiments. However, an embodiment of the invention can equally be applied to the second drain 20 or to both the first and the second drains 10, 20.

As an example, more than 90% of the evaporation of liquid in the first drain 10 may take place in the channel 46 rather than in the passageway 44. However, the figure of 90% is an estimate. Depending on the arrangement and use of the lithographic apparatus, the figure may be closer to 50%, for example. The large thermal load in the channel 46 leads to shrinking of the material taking place, which imparts a deformation to part of the substrate table WT and can result in deformation of the substrate W. Additionally, the cooling thermal load applied in the channel 46 may result in a cooling down of the center part of the substrate holder 30 also leading to deformation of the substrate W.

As depicted in FIG. 4, in an embodiment the lithographic apparatus comprises a channel 46 for the passage therethrough of a two phase flow. The channel 46 is formed within a block. In the arrangement depicted in FIG. 4, the block is a substrate holder 30 of a substrate table WT. It is not necessary for the block to be a substrate holder 30. For example, in an embodiment the block may be a liquid confinement structure IH, for example. In the description below, the invention will be primarily described with reference to a channel 46 that is positioned radially outward of the substrate W on the substrate holder 30. However, it is not necessary for the channel 46 to be radially outward of the substrate W. For example, the invention is equally applicable to the channel 26 depicted in FIG. 4 as being positioned below the substrate W.

The block e.g. the substrate holder 30 as depicted in FIG. 4 is of a first material 100. It is not necessary for the block e.g. the substrate holder 30 to be formed from only the first material 100. For example, other materials may also be used in addition to the first material 100 to form the substrate holder 30. However, the channel 46 is formed within the first material 100 such that the part of the substrate holder 30 near the channel 46 is formed of the first material 100. Thermal loads from the channel 46 can enter the first material 100.

In use of the lithographic apparatus, a two phase flow passes through the channel 46. For example, liquid together with gas may be removed from the gap 5 through the channel 46 via the opening 42 and the passageway 44. A disadvantage of the two phase flow is that it can result in undesirable temperature changes in the substrate W and parts of the substrate table WT such as the substrate holder 30. For example, the substrate W and the substrate holder 30 may be cooled down. Such undesirable temperature changes can cause deformations in the substrate W and the substrate holder 30. Such deformations can cause an overlay error.

Figure 5:
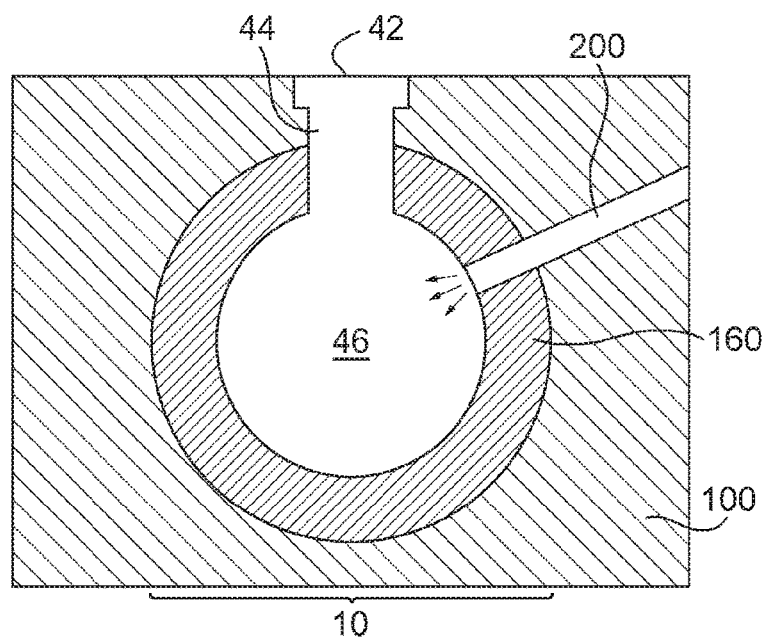

FIG. 5 depicts in cross-section a part of a lithographic apparatus according to an embodiment of the invention. The arrangement illustrated in FIG. 5 and described below may be applied to the lithographic apparatus described above and illustrated in FIG. 1. The arrangement illustrated in FIG. 5 and described below may be applied to the liquid supply systems described above and illustrated in FIG. 2 and FIG. 3. The arrangement illustrated in FIG. 5 and described below may be applied to the arrangement described above and illustrated in FIG. 4. As depicted in FIG. 5, in an embodiment the lithographic apparatus comprises a second material 160. The second material 160 is between the first material 100 and the channel 46. A purpose of the second material 160 is to locally thermally isolate the channel 46. In an embodiment the second material 160 is a solid material.

In an embodiment the thermal conductivity of the second material 160 is less than or equal to 10 W/mK or less than or equal to 5 W/mK. In an embodiment the thermal conductivity of the second material 160 is less than or equal to 2 W/mK. In an embodiment the thermal conductivity of the second material 160 is less than or equal to 1 W/mK. In an embodiment the second material 160 is high-density polyethylene (HDPE). In an embodiment the second material 160 is polypropylene (PP). In an embodiment the second material 160 is polyvinyl chloride (PVC). In an embodiment the second material 160 is rubber. In an embodiment the second material 160 is cork. Glass has a thermal conductivity of 1.05 W/mK at 25° C. PTFE has a thermal conductivity of 0.25 W/mK at 25° C. HDPE, has a thermal conductivity of 0.45 W/mK at 25° C. PP has a thermal conductivity of 0.15 W/mK 25° C. PVC has a thermal conductivity of 0.19 W/mK at 25° C. Rubber has a thermal conductivity of 0.13 W/mK at 25° C. Cork has a thermal conductivity of 0.07 W/mK at 25° C. This compares with the thermal conductivity of the first material of 100 W/mK. Thus, the channel 46 is locally isolated with a low thermal conductivity material from the first material 100. When the second material 160 comprises a 0.5 mm thick PTFE element, an embodiment of the invention is expected to achieve a total improvement of about 50% in thermal load. Other materials may be used for the second material 160. In an embodiment the second material 160 is a composite material. In an embodiment the second material 160 comprises cavities of gas enclosed in a matrix. For example, cork is an example of a material that comprises cavities of gas enclosed in a matrix.

In the embodiment of FIG. 5 the second material 160 may take the form of an insert, e.g. a pipe, which is not self-supporting and which is supported by the first material 100 (for example is supported on a surface of a channel formed in the first material 100). In an embodiment the second material 160 may be in the form of a coating, for example a glass coating. In an embodiment the second material 160 may be in the form of a pipe which is inserted into a channel formed in the first material 100.

By providing that the second material 160 has a low thermal conductivity, the second material 160 acts as a low-pass filter because of larger time constants in heat variations. Additionally, particularly if the first material 100 is made of PTFE, liquid has a high contact angle with this (e.g., it is hydrophobic) and this results in lower residence time of liquid in the channel 46.

In an embodiment the second material satisfies $\lambda/\rho C_{specific} \leq 1 \times 10^{-6}$ m²s⁻¹, the thermal conductivity at 25° C. of the second material 160 in Wm⁻¹K⁻¹. $\rho$ is a density of the second material 160 in kgm⁻³. $C_{specific}$ is a specific heat capacity of the second material 160 in Jkg⁻¹K⁻¹.

By providing that the second material 160 satisfies $\lambda/\rho C_{specific} \leq 1 \times 10^{-6}$ m²s⁻¹, the second material 160 reduces dynamic thermal load variations that can reach components such as the substrate holder 30 and the substrate W from the channel 46. By providing that the second material 160 satisfies $\lambda/\rho C_{specific} \leq 1 \times 10^{-6}$ m²s⁻¹, the second material 160 acts as a heat buffer, which filters dynamic thermal load variations occurring in the channel 46 before the thermal load variations enter the substrate holder 30, for example, where the thermal load variations can be harmful to performance of the lithographic apparatus.

By requiring that the second material 160 satisfies $\lambda/\rho C_{specific} \leq 1 \times 10^{-6}$ m²s⁻¹, the second material 160 is required to have a property that combines thermal conductivity and heat capacity. This is an improvement on requiring the second material 160 to have a low thermal conductivity, but without requiring it to have a high heat capacity in combination with the low thermal conductivity. By requiring the second material 160 to have a low thermal conductivity, a static thermal load on the substrate holder 30 and the substrate W caused by the channel 46 may be reduced. A static thermal load is a thermal load that does not substantially vary over time. The reduction of the static thermal load may be realised by the heat resistance of the second material 160 implied by its low thermal conductivity. However, without requiring that the second material 160 has a property of relatively high heat capacity in combination with heat resistance, the second material 160 may not necessarily reduce dynamic (in contrast to static) thermal load variations from the channel 46 on the substrate holder 30 or the substrate W. A dynamic thermal load is a thermal load that substantially varies over time. For example, if the second material 160 has a low heat capacity then the second material 160 may not be effective at reducing dynamic thermal load variations. In an embodiment the second material 160 has both relatively low thermal conductivity and relatively high specific heat capacity.

According to the invention, thermal load variations caused by the two phase flow in the channel 46 are filtered by the second material 160 which satisfies $\lambda/\rho C_{specific} \leq 1 \times 10^{-6}$ m²s⁻¹. When the two phase flow causes a thermal load variation that would otherwise reduce the temperature of the substrate holder 30, the thermal load variation may be reduced or filtered out by the second material 160 that acts as a buffer. The combination of the heat capacity with heat resistance of the second material 160 allows the second material 160 to act as a thermal buffer.

It is more important to reduce dynamic thermal load variations than to reduce static thermal load offsets. This is because a static thermal load offset can be more easily compensated for by calibration of the lithographic apparatus. A static thermal load offset may be compensated for by a thermal control loop of the lithographic apparatus. A static thermal load offset is a thermal load offset that does not substantially vary over time. On the other hand, it is more difficult to compensate for a dynamic thermal load variation by calibration or a thermal control loop. A dynamic thermal load variation is the variation of a thermal load over time. A dynamic thermal load variation may typically lead to a reduction in performance of the lithographic apparatus. By reducing the dynamic thermal load variations, the invention improves the performance of the lithographic apparatus.

In addition to reducing dynamic thermal load variations, the invention reduces any static thermal load offset. In an embodiment, the invention results in dampening of the dynamic thermal load variations. Dampening of the dynamic thermal load variations can have a much larger positive effect on performance of the lithographic apparatus compared to reduction of a static thermal load offset alone. Thermal loads may exist in parts of the lithographic apparatus such as the channel 46. Such thermal loads can cause temperature changes in other components of the lithographic apparatus such as the substrate table WT (or the substrate holder 30 and the substrate W. There is a delay between the thermal load at the channel 46 and the associated temperature change at the substrate table WT or the substrate. W. The length of the delay may be referred to as a time constant. An embodiment of the invention is expected to achieve larger time constants associated with temperature changes of components of the lithographic apparatus such as the substrate holder 31) and the substrate W. The second material 160 acts as a thermal low-pass filter.

In an embodiment, the second material 160 is selected from a group consisting of poly p-xylylene polymer, PTFE, glass, ceramic e.g. porcelain and Bakelite. Table 1 shows possibilities for the second material 160, together with their values of thermal conductivity at 25° C., density and specific heat capacity. Table 1 also shows the value of the ratio α of the thermal conductivity to the product of the density and specific heat capacity, where $\alpha=\lambda/\rho C_{specific}$. The value of the ratio α is an indicator of how good the second material 160 acts as a thermal buffer. The lower the value of the ratio α, the better the second material 160 will act as a thermal buffer, thereby reducing dynamic thermal load variations at the substrate holder 30 and the substrate W.

TABLE 1

| Material | λ [W/mK] | ρ [kg/m³] | $C_{specific}$ [J/kg K] | α [m²/s] |
|---|---|---|---|---|
| PTFE | 0.25 | 2.2 × 10³ | 1.0 × 10³ | 1.14 × 10⁻⁷ |
| poly p-xylylene polymer | 0.082 | 1.289 × 10³ | 711 | 8.9 × 10⁻⁸ |
| Glass | 0.93 | 2.5 × 10³ | 800 | 4.65 × 10⁻⁷ |
| porcelain ceramic | 1.5 | 2.4 × 10³ | 800 | 7.81 × 10⁻⁷ |
| Bakelite | 0.2 | 1.3 × 10³ | 920 | 1.67 × 10⁻⁷ |

As shown in the last column of Table 1, for each of poly p-xylylene polymer, PIPE, glass, porcelain ceramic and Bakelite, $\lambda/\rho C_{specific} \leq 1 \times 10^{-6}$ m²s⁻¹ is satisfied.

In an embodiment the second material 160 satisfies $\lambda/\rho C_{specific} \leq 1 \times 10^{-7}$ m²s⁻¹. Table 1 shows that poly p-xylylene polymer satisfies $\lambda/\rho C_{specific} \leq 1 \times 10^{-7}$ m²s⁻¹. However, none of PTFE, glass, porcelain ceramic and Bakelite satisfies $\lambda/\rho C_{specific} \leq 1 \times 10^{-7}$ m²s⁻¹.

By providing that the second material 160 satisfies $\lambda/\rho C_{specific} \leq 1 \times 10^{-7}$ m²s⁻¹, the second material 160 has a particularly good property of having high heat capacity and low thermal conductivity. Accordingly, the second material 160 that satisfies $\lambda/\rho C_{specific} \leq 1 \times 10^{-7}$ m²s⁻¹ has a combination of heat capacity and heat resistance. This means that the second material 160 is particularly good at providing a thermal buffer for reducing dynamic heat variations from the channel 46 to the substrate holder 30 or the substrate W, for example.

Figure 6:
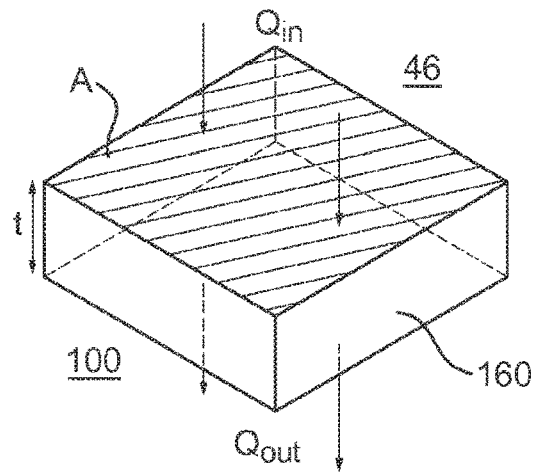
FIG. 6 depicts, in perspective view a part of a second material of an embodiment.

FIG. 6 depicts schematically heat transferring into and out from the second material 160. In FIG. 6, the thermal load, which may be positive or negative, transferred from the channel 46 to the second material 160 is referenced by $Q_{in}$. In FIG. 6, the thermal load, which may be positive or negative, transferred from the second material 160 to the first material 100 is referenced by $Q_{out}$. The thickness of the second material 160 between the channel 46 and the first material 100 is referenced by t. The surface area of the second material 160 facing the channel 46 is referenced by A. The second material 160 has a thermal conductivity at 25° C. of λ.

The heat resistance $R_{th}$ of the second material 160 is related to its thickness t, its thermal conductivity λ and the surface area A by the equation $R_{th}=t/\lambda A$. The heat capacity $C_p$ of the second material 160 is related to its specific heat capacity $C_{specific}$, its density ρ, the surface area A and the thickness t by the equation $C_p=\rho A t C_{specific}$. The heat capacity $C_p$ is measured in JK⁻¹. The specific heat capacity $C_{specific}$ is measured in Jkg⁻¹K⁻¹.

The physical effects of the heat resistance $R_{th}$ and the heat capacity $C_p$ together result in a heat buffering effect by the second material 160. The system of heat transferral between the channel 46 and the substrate holder 30, for example, may be approximated as a first order system having a time constant τ. The time constant τ is related to the delay between a thermal load at the channel 46 and the associated temperature change at the substrate table WT, for example. The time constant τ is related to the thermal resistance $R_{th}$ and the heat capacity $C_p$ by the following equation: $\tau=R_{th}C_p$. By substituting into this equation, the time constant τ can be expressed as being related to the thickness t of the second material 160, the density ρ of the second material 160, the specific heat capacity $C_{specific}$ of the second material 160 and the thermal conductivity λ of the second material 160 by the following equation $\tau=t^2\rho C_{specific}\lambda^{-1}$.

A thermal load variation occurring inside the channel 46 that is transferred through into the first material 100 of the substrate holder 30 may be described by a heat transfer function H(f), where f is the frequency of heat variations within the channel 46. The magnitude of H(f) is an indication of how much the thermal load variation is reduced by the second material 160. For example, when the thermal load variation is reduced by a thermal load variation reduction factor of X by the second material 160, then the magnitude of H(f) is equal to X⁻¹. The thermal load variation reduction factor may be termed X, where |H(f)|=1/X. The thermal load variation reduction factor X is the factor by which the invention reduces thermal load variations relative to if the second material 160 were not provided. The reference point for the thermal load variation reduction factor X is a channel 46 that is not provided with the second material 160. It is desirable for the thermal load variation reduction factor to be high. Hence it is desirable for X⁻¹ to be low.

For a first order heat transferral system, the heat transfer function H(f) is related to the time constant t by the following equation $|H(f)|=|(if\tau+1)^{-1}|=(f^2\tau^2+1)^{-1/2}$, where f is the frequency of the thermal load variation and i is the imaginary unit $\sqrt{-1}$. Substituting into this equation for the time constant τ, the thermal load variation reduction factor X is related to the system parameters by the following equation $X^{-1}=(f^2t^4\tau^2C_{specific}^2\lambda^{-2}+1)^{-1/2}$. In view of the fact that approximating the system as a first order model is not 100% accurate regarding how the thermal load variation reduction factor varies with the thickness t of the second material 160, and so as to allow for calibration with computational experiments, a correction factor K may be added into the equation to provide the following equation $X^{-1}=(Kf^2t^4\rho^2C_{specific}^2\lambda^{-2}+1)^{-1/2}$.

The frequency f of the thermal load variation is a property of how the lithographic apparatus is used. Thermal load variations in the channel 46 at the edge of the substrate W may be caused by gas flow variations through the openings 42 and the passageway 44. Such gas flow variations may be caused by the liquid confinement structure IH crossing the gap 5 at the edge of the substrate W. The time constant associated with such crossings defines the frequency f of the thermal load variations.

A computational experiment was performed. According to the experiment, poly p-xylylene polymer was used as the second material 160, having the properties as shown in table 1. The thickness t of the second material 160 was 0.5 mm. In the experiment, the liquid confinement structure crosses the gap 5 with a time constant of about 0.6 s. Hence, the frequency f of the thermal load variation was the reciprocal of 0.6 s, i.e. 1.67 s$^{-1}$. The result of the experiment was that thermal load variations were reduced by a factor X of 10. From this experiment, the correction factor K can be calculated. The correction factor K can be calculated using the following equation $K=(X^2-1)\lambda^2 f^2 t^{-4} \rho^{-2} C_{specific}^{-2}$. From the experiment, the correction factor K may be determined to be 4.52 (to three significant figures).

In general, the thicker the second material 160, the greater the reduction in thermal load variations. However, it is desirable for the second material 160 to be relatively thin so as to reduce the amount of the second material 160 that is required, to keep the channel 46 as wide as possible, and to make it easier to apply the second material 160 between the channel 46 and the first material 100. In an embodiment the thickness t of the second material 160 is at most about 1 mm.

The thickness of the second material 160 required to achieve a certain thermal load variation reduction factor X may be calculated using the following equation $$t=[(X^2-1)\lambda^2 K^{-1} f^{-2} \rho^{-2} C_{specific}^{-2}]^{1/4}.$$

By providing that $\lambda/\rho C_{specific} \leq 1 \times 10^{-7}$ m$^2$s$^{-1}$, the thickness t of the second material 160 required to achieve a set thermal load variation reduction factor X can be reduced. For example, by providing that the second material 160 is poly p-xylylene polymer, the thickness t of the second material 160 can be reduced compared to if the second material 160 were PTFE glass or ceramic, while achieving the same thermal load variation reduction.

In an embodiment the second material 160 has a thickness t of at least 200 μm. By providing that the second material 160 has a thickness of at least 200 μm, a minimum level of thermal load variation reduction is achieved. In particular, when the second material 160 is poly p-xylylene polymer, then by providing that the thickness t is at least 200 μm, a thermal load variation reduction factor X of at least 2 is achieved. The thermal load variation reduction factor X is a measure of the reduction in thermal load variation achieved by the invention. The reduction is measured relative to an arrangement in which the second material 160 is not provided.

In an embodiment the second material 160 has a thickness t of at least 350 μm. By providing that the second material 160 has a thickness t of at least 350 μm, a higher minimum level of thermal load variation reduction is achieved. In particular, when the second material 160 is poly p-xylylene polymer, a thermal load variation reduction factor X of at least 5 is achieved. The thermal load variation reduction factor X is a measure of the reduction in thermal load variation achieved by the invention. The reduction is measured relative to an arrangement in which the second material 160 is not provided.

In an embodiment, the second material 160 is between substantially all of the channel 46 and the first material 100. This means that the second material 160 lines the whole of the channel 46. However, this need not necessarily be the case. In an embodiment, the second material 160 is between only a part of the channel 46 and the first material 100. For example, in an embodiment only the area most affected by the gas flows that impart a thermal load are provided with the second material 160. For example, in an embodiment the second material 160 is between the bottom of the channel 46 and the first material, but not between the sides or top of the channel 46 and the first material. At the sides and the top of the channel 46, the channel 46 may be directly adjacent the first material 100 without the second material 160 between. It is more important for the second material 160 to be at the bottom of the channel 46 so as to intercept thermal loads that would otherwise reach the first material 100 directly from the opening 42, for example. In an embodiment the second material 160 is provided at the openings 42 and the passageway 44.

As depicted in FIG. 4, in an embodiment the lithographic apparatus comprises an object table e.g. a substrate table WT formed from the block of the first material 100. In an embodiment the object table comprises an object holder e.g. substrate holder 30 to hold an object e.g. substrate W. In an embodiment the object table comprises an opening 42 adjacent an edge of the substrate holder. In an embodiment the channel 46 is in fluid communication with the opening 42 via the object table.

In an embodiment the lithographic apparatus comprises a liquid confinement structure IH. The liquid confinement structure IH is configured to confine immersion fluid in a localised region between a final element of the projection system PS and a surface of a substrate W. In an embodiment the fluid confinement structure is formed from the block of the first material 100. In an embodiment the liquid confinement structure 111 comprises an opening in fluid communication with the channel associated with the outlet 14, which is depicted in FIG. 2.

Figure 7:
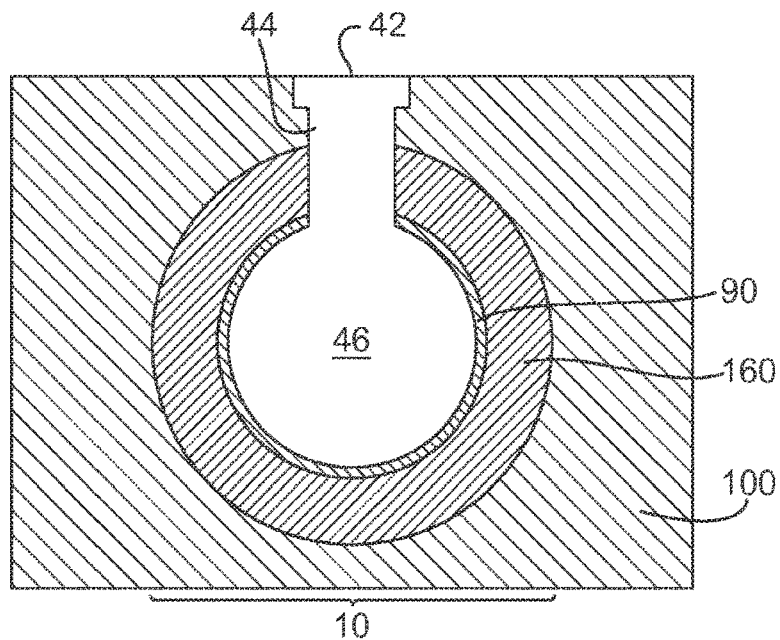

FIG. 7 depicts in cross-section a part of lithographic apparatus according to an embodiment of the invention. As depicted in FIG. 7, in an embodiment the lithographic apparatus comprises a third material 90. The third material 90 is between the second material 160 and the channel 46. In an embodiment the third material 90 has a thermal conductivity higher than that of the second material 160.

By providing the third material 90 having a thermal conductivity higher than that of the second material 160, thermal load variations on the substrate holder 30 caused by the two phase flow in the channel 46 can be reduced. In an embodiment the third material 90 is a solid material. The third material 90 has an effect of spreading a head load from the channel 46 across the third material 90. The third material 90 spreads spatially within itself the thermal load caused by e.g. evaporation within the two phase flow. As a result, the thermal load is more spatially spread when it is transferred to the second material 160. This means that the effect of the second material 160 acting as a heat shield and/or as a heat buffer is used more effectively. This is explained further with reference to FIG. 8 and FIG. 9.

FIG. 8 depicts a part of a lithographic apparatus according to an embodiment of the present invention. In the arrangement depicted in FIG. 8, no third material 90 is provided between the second material 160 and the channel 46. The large arrow at the top of FIG. 8 represents a flow of gas in the channel 46 directed towards a particular thermal load point 92 at the interface between the channel 46 and the second material 160. The thermal load may be caused by evaporation of liquid in the two phase flow within the channel 46 for example. The thermal load is concentrated at the thermal load point 92.

As depicted by smaller arrows in FIG. 8, the thermal load is transferred through the thickness of the second material 160. Within the second material 160, the thermal load is spread out spatially but only to a limited extent. The dashed lines shown in FIG. 8 represent the spatial extent of the thermal load variations within the second material 160. As such, the thermal load variations remain to a large extent concentrated spatially within the second material 160. The limited spatial extent of the thermal variations within the second material 160 limits the effectiveness of the second material 160 in reducing thermal load variations at the first material 100.

FIG. 9 depicts in cross-section a part of a lithographic apparatus according to an embodiment of the invention. In the arrangement depicted in FIG. 9, the third material 90 is provided between the channel 46 and the second material 160. A thermal load from the channel 46 is concentrated at a thermal load point 92 at the interface between the channel 46 and the third material 90. As shown in FIG. 9 by arrows, the thermal load is spread spatially to a great extent within the third material 90. As a result, the thermal load transfer within the second material 160 is more uniform compared to in the arrangement depicted in FIG. 8, for example. The high thermal conductivity third material 90 improves the effectiveness of the second material 160 in reducing thermal load variations reaching the first material 100.

The gas flow that provides a thermal load at the thermal load point 92 may be a gas flow directed from the opening 42 via the passageway 44. In an embodiment without third material 90, approximately 90%, for example, of the thermal load due to the gas flow at the thermal load point 92 may be expected to be transferred through the second material 160 as depicted in FIG. 8. However, the figure of 90% is an estimate. Depending on the arrangement and use of the lithographic apparatus, the figure may be closer to 50%, for example.

The remaining 10% of the thermal load may be expected to be transferred through the channel 46, from where it may transfer through an extraction hole, for example. On the other hand, where the third material 90 is provided between the second material 160 and the channel 46 the percentage of the thermal load from the thermal load point 92 that is transferred directly through the second material 160 may be reduced to about 60%. In this case the remaining 40% may be transferred along the channel 46. Hence, the thermal load is spread out spatially by the third material 90.

The third material 90 desirably has a high thermal conductivity. In an embodiment the third material 90 is a metal. For example in an embodiment the third material 90 is selected from a group consisted of stainless steel, copper, silver, gold and platinum.

An advantage of stainless steel, silver, gold and platinum relative to copper is that there is a reduction in contamination of the lithographic apparatus environment by these metals. However, the third material 90 is not particularly limited provided that it has a higher thermal conductivity than the second material 160. For example, any metal may be used as the third material 90. In an embodiment the thermal conductivity of the third material 90 is at least one order of magnitude higher than that of the second material 160. Other materials may be used for the third material 90. In an embodiment the third material 90 is silicon infiltrated silicon carbide (SiSiC).

In an embodiment the thickness of the third material 90 is at most 100 µm. By providing that the thickness of the third material 90 is at most 100 µm, the amount of third material 90 required is relatively small and the third material 90 takes up relatively little space within the system.

In an embodiment the thickness of the third material 90 is at least 10 µm. By providing that the thickness of the third material 90 is at least 10 µm, the third material 90 is easier to apply between the second material 160 and the channel 46.

In an embodiment, the third material 90 is continuous. For example, the third material 90 may be a continuous layer between the second material 160 and the channel 46. By providing that the third material 90 is continuous, the third material 90 may be applied as a liquid or gel, which solidifies into a continuous layer of the third material 90. Such a liquid or gel may be applied by inserting the liquid through one or more openings into the channel 46. For example, extraction holes from the base of the channel 46 and/or the openings 42 at the upper end of the channel 46 may be used to apply liquid or gel so as to form the third material 90.

Figure 10:
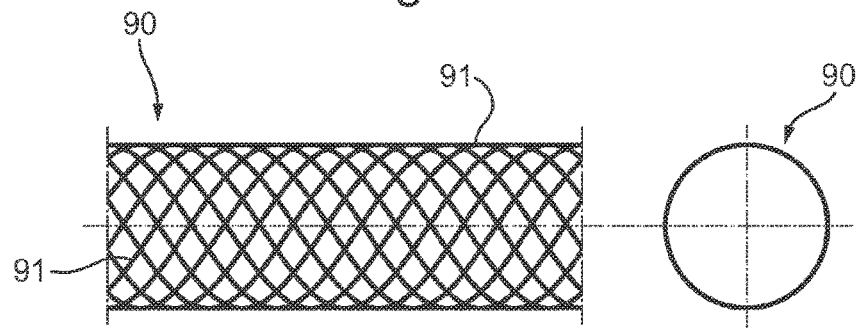
FIG. 10 depicts, in side view and in cross-section, a part of a third material of an embodiment.

It is not necessary for the third material 90 to be continuous. FIG. 10 depicts a side view and a front view of the third material 90 according to an embodiment of the invention. As depicted in FIG. 10, in an embodiment the third material 90 is formed as a mesh or a network of connected pieces 91 of the third material 90. In as embodiment the third material 90 only covers a part of the inner side of the second material 160. In an embodiment the third material 90 has a mesh structure. In an embodiment the third material 90 has a cylindrical form, as depicted in FIG. 10, for example. Desirably, the third material 90 has a form and shape that allows it to cover the inner side of the whole of the second material 160.

Even when the third material 90 is discontinuous, for example having mesh structure, the third material 90 effectively spreads the thermal load. A mesh of third material is equally as effective as a continuous layer of third material 90 (for a given overall volume of third material 90).

By providing that the third material 90 is formed as a mesh or a network of connected pieces 91 of the third material 90, the third material 90 can be inserted into the channel 46 in a similar fashion to the way in which a stent is inserted into a blood vessel during medical surgery. In an embodiment connected pieces 91 of the third material 90 may be mounted onto an inflatable balloon. The third material 90 mounted on the inflatable balloon may be inserted into the channel 46. The third material 90 may then be deposited between the second material 160 and the channel 46. The third material 90 may be deposited by inflating the inflatable balloon.

Figure 11:
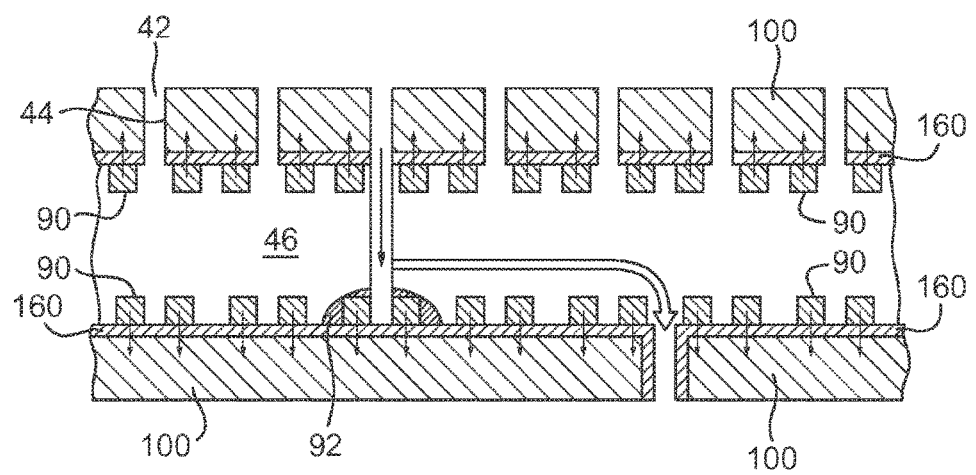
FIG. 11 depicts, in cross-section, a part of a substrate table of an embodiment.

FIG. 11 depicts in cross-section a part of a lithographic apparatus according to an embodiment of the invention. In the arrangement depicted in FIG. 11, the third material 90 is provided as a mesh or a network of connected pieces 91 of the third material 90. A gas flow causing a thermal load may be incidence on the thermal load point 92 at the interface between the channel 46 and the third material 90. The thermal load is spread by the high thermal conductivity third material 90. Following the spreading, the thermal load is transferred through the second material 160. The second material 160 has a property of heat resistance and/or a property of heat capacity, thereby reducing thermal load variations that reach the first material 100.

In an embodiment, the channel 46 is formed within a block that comes in two or more pieces. For example, the sides and bottom of the channel 46 may be formed by a separate piece of the block from the piece of the block that forms the top of the channel 46. The two or more pieces may be glued together so as to form the channel 46 within the block. In the ease that the block comes in two or more pieces, the second material 160 and/or the third material 90 may be provided before the two pieces of the block are connected together.

An advantage of inserting the second material 160 and/or the third material 90 through openings in fluid communication with the channel 46 is that the second material 160 and/or the third material 90 can be provided after the channel 46 has been formed within the block. This means that it is not necessary for the block to be made in two or more pieces. Connecting two or more pieces of the block together so as to form the channel can require the temperature of the block and the channel 46 to be raised to a temperature that the second material 160 may not be able to withstand. For example, PTFE and poly p-xylylene polymer cannot withstand very high temperatures. However, glass and porcelain ceramic can withstand very high temperatures. Hence glass or porcelain ceramic may be provided before connecting two or more pieces of the block together so as to form the channel 46.

It is not necessary for the third material 90 to be provided. Even when the third material 90 is not provided, by providing that the second material 160 satisfies $\lambda/\rho C_{specific} \leq 1 \times 10^{-7}$ $m^2 s^{-1}$, the second material 160 acts as a thermal buffer that reduces thermal load variations compared to systems in which the second material does not satisfy $\lambda/\rho C_{specific} \leq 1 \times 10^{-7}$ $m^2 s^{-1}$.

It is not necessary for the second material 160 to satisfy $\lambda/\rho C_{specific} \leq 1 \times 10^{-6}$ $m^2 s^{-1}$. By providing the third material 90, the third material 90 spreads the thermal load spatially across the second material 160, thereby reducing thermal load variations. In this case, in an embodiment the second material 160 has a specific heat capacity higher than that of the first material 100. By providing that the second material 160 has a specific heat capacity higher than that of the first material 100, the second material 160 acts as a thermal buffer. The thermal buffer can partially store thermal variations from the channel 46 before transferring any thermal load to the first material 100. Accordingly, the dynamic thermal load variations are reduced.

However, it is not necessary for the second material 160 to have a specific heat capacity higher than that of the first material 100. In an embodiment the second material 160 has a thermal conductivity lower than that of the first material 100. By providing that the second material 160 has a thermal conductivity lower than that of the first material 100, the second material 160 provides heat resistance between the channel 46 and the first material 100.

Figure 12:
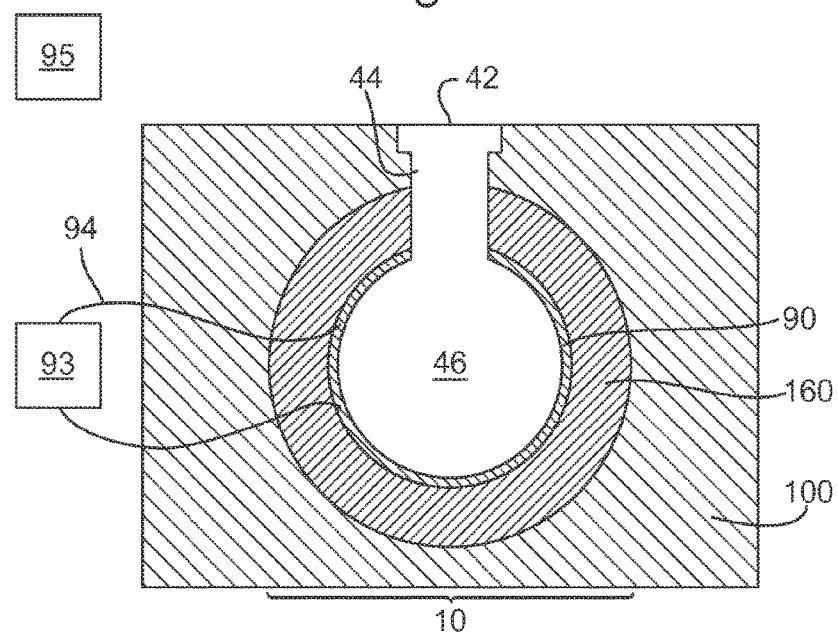
FIG. 12 depicts, in cross-section, a part of a substrate table of an embodiment.
Figure 13:
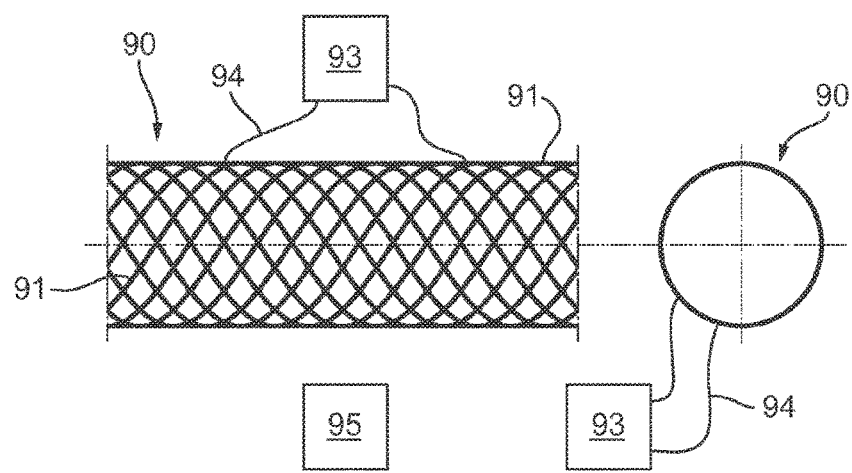
FIG. 13 depicts, in side view and in cross-section, a part of a third material of an embodiment.

As depicted in FIG. 12 and FIG. 13, in an embodiment the third material 90 is formed as a heater. The heater comprises the third material 90. The third material 90 is configured to function as the heating element of the heater. The heater is an electric heater.

In an embodiment the third material 90 is electrically connected to a heater power source 93. The heater power source 93 is configured to provide an electric current to the third material 90. The electric current passes through the third material 90. The electrical energy from the electric current is converted into heat energy in the third material 90.

In an embodiment the third material 90 is connected to the heater power source 93 by electric leads 94. The material used for the electric leads is not particularly limited. The electric leads 94 are conductors of electricity. In an embodiment the electric leads 94 are formed from a metal such as copper.

As depicted in FIG. 13, in an embodiment the third material 90 is formed as a mesh or a network of connected pieces 91 of the third material 90. As depicted in FIG. 13, in an embodiment the two-dimensional mesh is a heater.

However, it is not necessary for the third material 90 to be formed as a mesh or a network in order for the third material 90 to be formed as a heater. As depicted in FIG. 12, in an embodiment the third material 90 is continuous and is formed as a heater.

In an embodiment the third material 90 has a circular diameter. Accordingly, when the third material 90 is formed as a heater, the heater is folded into a circular diameter. The third material 90 is surrounded by the second material 160. The second material 160 is a heat-isolator material. Accordingly, when the third material 90 is formed as a heater, the heater is surrounded by a heat-isolator material.

As depicted in FIG. 12 and FIG. 13, in an embodiment the lithographic apparatus comprises a thermal controller 95. The thermal controller 95 is configured to control the heater so as to locally compensate for a thermal load of the two phase flow. The two phase flow passes through the channel 46. A thermal load generated inside the channel 46 can be locally compensated by control of the heater. For example, a cold load generated by evaporation inside the channel 46 can be locally compensated by control of the heater. The second material 160 is configured to reduce any remaining thermal load (which is not compensated for by control of the heater) directly entering the first material 100.

The third material 90 has high thermal conductivity and functions as a heater. The high thermal conductivity of the third material 90 allows a thermal load in the channel 46 to spread through the third material 90. The function of the third material 90 as a heat spreader is a passive function. The third material 90 functions as a heater to locally compensate for a thermal load in the channel 46. The function of the third material 90 as a heater is an active function. An evaporation heat load inside the channel 46 is spread at the third material 90 and is also compensated for by active heating. In an embodiment the active heating is performed via copper wires.

As explained above, in an embodiment the second material 160 functions as a heat isolator and as a heat buffer. The second material 160 reduces the effect that a heat load in the channel 46 has on the first material 100 of the substrate table WT.

In an embodiment the third material 90 is formed as a segmented heater. In an embodiment the third material 90 is electrically connected to a plurality of heater power sources 93. Each heater power source 93 is configured to provide an electric current to a respective segment of the third material 90. The electric current passes through the respective segment of the third material 90. The electrical energy from the electric current is converted into heat energy in the respective segment of the third material 90.

Each segment of the third material 90 functions as a heater substantially independently of the other segments of the third material 90. The number of segments is not particularly limited. By dividing the third material 90 into more segments, a spatially distributed thermal load can be compensated for more effectively.

A further refinement is illustrated in FIG. 5. The further refinement may be applied to any other embodiment. The further refinement may be applied to only the first drain 10, only the second drain 20 or to both the first and second drains 10, 20. The refinement is the same as that described in United States patent application publication no. US 2008/0297744, the contents of which are hereby incorporated in their entirety. A liquid supply device configured actively to supply a liquid to the drain 10, 20 independent of the position of the substrate table WT is provided. The supply of a liquid (through channel 200) can result in a decrease in the amount of evaporation in the drain 10, 20. The way this is accomplished can be viewed in two separate ways. First, it can be seen as helping ensure that gas which would otherwise cause evaporation is saturated or at least nearly saturated with the same (type of) liquid as is used by the liquid confinement structure IH so that this gas passing over liquid in the drain 10, 20 cannot significantly cause evaporation. Second, it can be seen as providing a continuous flow of (immersion) liquid through the drain 10, 20 thereby evening out the thermal load over time.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "water" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet WV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a channel for the passage therethrough of a two phase flow, wherein the channel is formed within a block, the block being of a first material;
   a second material between the first material and the channel, wherein the second material has a specific heat capacity higher than that of the first material and/or a thermal conductivity lower than that of the first material; and
   a third material between the second material and the channel, wherein the third material has a thermal conductivity higher than that of the second material and is formed as a mesh or a network of connected pieces of the third material.

2. The lithographic apparatus of claim 1, wherein the second material satisfies $\lambda/(\rho C_{specific}) \leq 1 \times 10^{-6}$ m$^2$s$^{-1}$, where $\Delta$ is a thermal conductivity of the second material in Wm$^1$K$^{-1}$, $\rho$ is a density of the second material in kgm$^{-3}$ and $C_{specific}$ is a specific heat capacity of the second material in Jkg$^{-1}$K$^{-1}$.

3. The lithographic apparatus of claim 1, wherein the second material is selected from a group consisting of poly(p-xylylene) polymer, PTFE, glass and ceramic, and/or comprises poly(p-xylylene) polymer.

4. The lithographic apparatus of 1, wherein the third material is selected from a group consisting of stainless steel, copper, silver, gold, platinum and silicon infiltrated silicon carbide.

5. The lithographic apparatus of claim 1, wherein the third material is formed as a heater.

6. The lithographic apparatus of claim 5, further comprising a thermal controller configured to control the heater so as to locally compensate for a thermal load of the two phase flow.

7. The lithographic apparatus of claim 1, wherein the second material has a thickness of at least 200 μm.

8. The lithographic apparatus of claim 1, comprising an object table formed from the block of the first material, wherein the object table comprises:
   an object holder to hold an object; and
   an opening adjacent an edge of the object holder, wherein the channel is in fluid communication with the opening via the object table.

9. The lithographic apparatus of claim 1, comprising a fluid confinement structure configured to confine immersion fluid in a localized region between a final element of a projection system and a surface of a substrate, wherein the fluid confinement structure is formed from the block of the first material and comprises an opening in fluid communication with the channel.

10. A method of manufacturing at least part of a lithographic apparatus, the method comprising:
    providing a block of a first material within which a channel is formed;
    providing for the passage of a two phase flow through the channel;
    providing between the first material and the channel a second material, wherein the second material has a specific heat capacity higher than that of the first material and/or a thermal conductivity lower than that of the first material; and
    providing between the second material and the channel a third material, wherein the third material has a thermal conductivity higher than that of the second material and is formed as a mesh or a network of connected pieces of the third material.

11. The method of claim 10, wherein providing the third material comprises:
    mounting connected pieces of the third material onto an inflatable balloon;
    inserting the third material mounted on the inflatable balloon into the channel; and
    depositing the third material between the second material and the channel.

12. The method of claim 10, wherein the second material satisfies $\lambda/(\rho C_{specific}) \leq 1 \times 10^{-6}$ m$^2$s$^{-1}$, where $\Delta$ is a thermal conductivity of the second material in Wm$^1$K$^{-1}$, ρ is a density of the second material in kgm$^{-3}$ and C$_{specific}$ is a specific heat capacity of the second material in Jkg$^{-1}$K$^{-1}$.

13. The method of claim 10, wherein the second material is selected from a group consisting of poly(p-xylylene) polymer, PTFE, glass and ceramic, and/or comprises poly (p-xylylene) polymer.

14. The method of claim 10, wherein the third material is selected from a group consisting of stainless steel, copper, silver, gold, platinum and silicon infiltrated silicon carbide.

15. The method of claim 10, wherein the third material is formed as a heater.

16. The method of claim 10, further comprising providing a thermal controller configured to control the heater so as to locally compensate for a thermal load of the two phase flow.

17. The method of claim 10, wherein the second material has a thickness of at least 200 μm.

18. The method of claim 10, wherein the block of the first material is part of an object table of a lithographic apparatus, wherein the object table comprises:
   an object holder to hold an object; and
   an opening adjacent an edge of the object holder, wherein the channel is in fluid communication with the opening via the object table.

19. The method of claim 10, wherein the block of the first material is part of a fluid confinement structure, the fluid confinement structure configured to confine immersion fluid in a localized region between a final element of a projection system of a lithographic apparatus and a surface of a substrate, and the fluid confinement structure comprises an opening in fluid communication with the channel.

20. A lithographic apparatus comprising:
   a channel for the passage therethrough of a two phase flow, wherein the channel is formed within a block, the block being of a first material;
   a second material between the first material and the channel, wherein the second material has a specific heat capacity higher than that of the first material and/or a thermal conductivity lower than that of the first material; and
   a third material between the second material and the channel, wherein the third material has a thermal conductivity higher than that of the second material and is formed as a heater.

* * * * *